United States Patent [19]

Martineau

[11] Patent Number: 4,965,866
[45] Date of Patent: Oct. 23, 1990

[54] VERY LOW LOSS MICROWAVE MODULATOR HAVING TWO PHASE STATES O, $\pi$

[75] Inventor: Didier Martineau, Honorine, France

[73] Assignee: Alcatel N.V., Stuttgart, Fed. Rep. of Germany

[21] Appl. No.: 409,533

[22] Filed: Sep. 18, 1989

[30] Foreign Application Priority Data

Sep. 19, 1988 [FR] France ................................ 88 12192

[51] Int. Cl.$^5$ ............................ H01P 3/08; H01P 1/18
[52] U.S. Cl. .................................... 333/164; 333/104; 333/161
[58] Field of Search ............... 333/101, 103, 104, 139, 333/140, 156, 160, 161, 164

[56] References Cited

U.S. PATENT DOCUMENTS

| | | | |
|---|---|---|---|
| 3,346,822 | 10/1967 | Levy et al. ..................... | 333/164 X |
| 4,056,792 | 11/1977 | Horwitz et al. ................ | 333/103 X |
| 4,105,959 | 8/1978 | Stachejko ........................ | 333/164 X |
| 4,301,432 | 11/1981 | Carlson et al. ..................... | 333/164 |
| 4,789,846 | 12/1988 | Matsunaga et al. ................ | 333/104 |

OTHER PUBLICATIONS

Patent Abstracts of Japan, vol. 10, No. 255, (E—433)[2311], Sep. 2, 1986, & JP—A—61 81 057 (Toshiba Corp.), 04.24.1986.
Patent Abstracts of Japan, vol. 8, No. 53 (E—231)[1490], Mar. 9, 1984 & JP—A—58 206 265 (Nippon Denki K.K.) 12.1.1983.

Primary Examiner—Eugene R. LaRoche
Assistant Examiner—Seung Ham
Attorney, Agent, or Firm—Christie, Parker & Hale

[57] ABSTRACT

A very low loss microwave modulator having two phase states: O, $\pi$; the modulator comprising the following between an input (E) which receives a pure carrier at a frequency $f_O$, and an output which delivers a carrier modulated with two phases states: a first switching element (17); in parallel therewith, a second switching element (18) connected in series with a main transmission line (19); and a control system (20) for causing a selected one of the first and second switching elements (17, 18) to be conductive and for causing the other one to be non-conductive. The invention is particularly suitable for microwave transmission.

2 Claims, 1 Drawing Sheet

VERY LOW LOSS MICROWAVE MODULATOR HAVING TWO PHASE STATES 0, π

The invention relates to a very low loss microwave modulator having two phase states: 0, π.

BACKGROUND OF THE INVENTION

Coherent modulation is characterized by the fact that the frequency of the carrier is a multiple of the clock frequency of the binary signal to be transmitted. For high digital data rates, coherence is difficult to retain and so modulation is of a non-coherent type: phase skips take place at instants when the phase of the carrier has a random value $\phi$ uniformly distributed over the interval $(0, 2\pi)$. If the signal to be transmitted is represented by a successive of 0s and 1s each of duration T, and the signal is modulated with direct encoding using two phase states, correspondence is established between binary values 0 and 1 and respective selected ones of the two phase states. In order to facilitate recognition on demodulation, it is clear that the phase states should be as far as apart as possible: i.e. 0 and $\pi$.

SUMMARY OF THE INVENTION

The present invention provides a very low loss microwave modulator having two phase states: 0, $\pi$; the modulator comprising the following between an input which receives a pure carrier at a frequency $f_0$, and an output which delivers a carrier modulated with two phase states:
a first switching element;
in parallel therewith, a second switching element connected in series with a main transmission line; and
a control system for causing a selected one of the first and second switching elements to be conductive and for causing the other one to be non-conductive;
wherein said main transmission line is of length $L = \lambda_0/2$ where $\lambda_0$ is the wavelength corresponding to the frequency $f_0$, and wherein said control circuit comprises three transmission lines of length $\lambda_0/4$ having their first ends respectively connected as follows:
the first line to the point common to the two switching elements;
the second line to the second terminal of the first switching element; and
the third line to that end of the main line which is not connected to the second switching element;
the first line having its second end connected to ground, and the other two lines having their second ends connected to receive respective control signals and connected to ground via respective capacitors; and
a capacitor being inserted between the main line and the second terminal of the first switching element.

In a particular embodiment, the switching elements are PIN diodes.

BRIEF DESCRIPTION OF THE DRAWING

An embodiment of the invention is described by way of example with reference to the accompanying drawing, in which.

DETAILED DESCRIPTION

Figure 1:
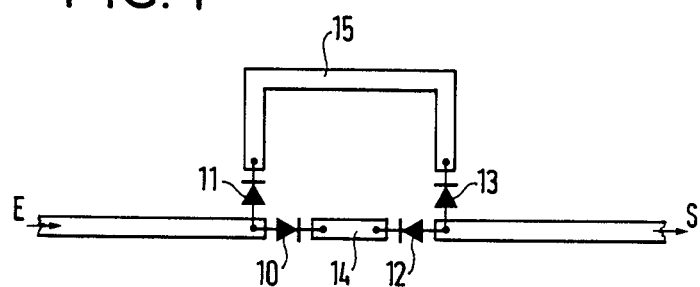
FIG. 1 shows a prior art modulator.

A conventional modulator, as shown in FIG. 1, comprises four diodes 10, 11, 12, and 13, with the first two diodes 10 and 11 having their anodes connected to an input E, and with the other two diodes 12 and 13 having their anodes connected to an output S. The diodes 10 and 12 are interconnected by a line 14 of length L, while the diodes 11 and 13 are interconnected by a line 15 of length $L + \lambda_0/2$, where $\lambda_0$ is the wavelength of the input signal.

In this modulator, a control system (not shown) serves to cause either diodes 10 and 12 to conduct or else to cause diodes 11 and 13 to conduct. The difference between the lengths of the paths travelled by the carrier depending on whether the signal is conveyed by the line 14 or by the line 15, is thus equal to $\lambda_0/2$. This corresponds to shifting the phase of the carrier through $\pi$.

Figure 2:
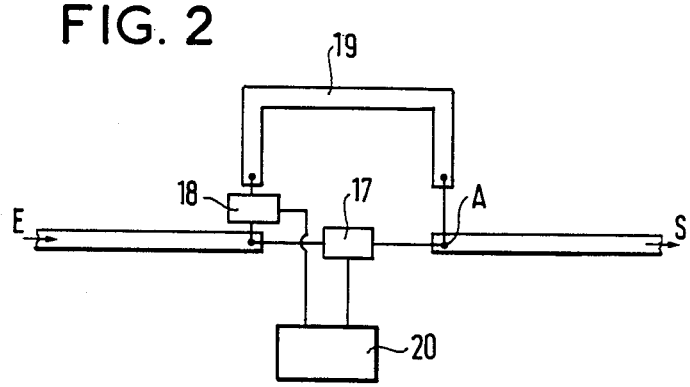
FIGS. 2 and 3 show a modulator of the invention.

As shown in FIG. 2, a modulator of the invention comprises, between an input E which receives a pure carrier at the frequency $f_0$ and an output S which delivers a carrier modulated with two phase states: 0, $\pi$; a first very low loss switching element 17 whose impedance varies as a function of the current flowing therethrough, e.g. a PIN diode, and in parallel therewith, a second very low loss switching element 18 in series with a main line of length $L = \lambda_0/2$, where is the wavelength corresponding to the frequency $f_0$.

A control system 20 serves to cause one or other of the first and second switching elements 17 and 18 to conduct while preventing the other one of them from conducting.

Since the length L of the transmission line 19 is equal to $\lambda_0/2$ at the frequency $f_0$, loading the line at one of its ends with an impedance Ze, causes the impedance measured at its opposite end, Zs, to be the same: Zs=Ze.

In operation:
When element 17 conducts and element 18 does not conduct, element 18 presents infinite impedance so the impedance applied by the line 19 to point A is infinite. The carrier $f_0$ therefore passes through the element 17 and the line 19 does not disturb the impedance at point A.

When element 18 conducts and element 17 does not conduct, the element 17 presents an infinite impedance. The carrier $f_0$ passes via the element 18 and the line 19. It is phase shifted through $\pi$ (length $L = \lambda_0/2$) relative to the path followed when the element 17 is conductive.

As defined above, the modulator thus has two phase states, but requires only two switching elements 17 and 18 (e.g. two PIN diodes), instead of four as in the conventional circuit. Its loss is therefore half the loss of the conventional circuit.

Figure 3:
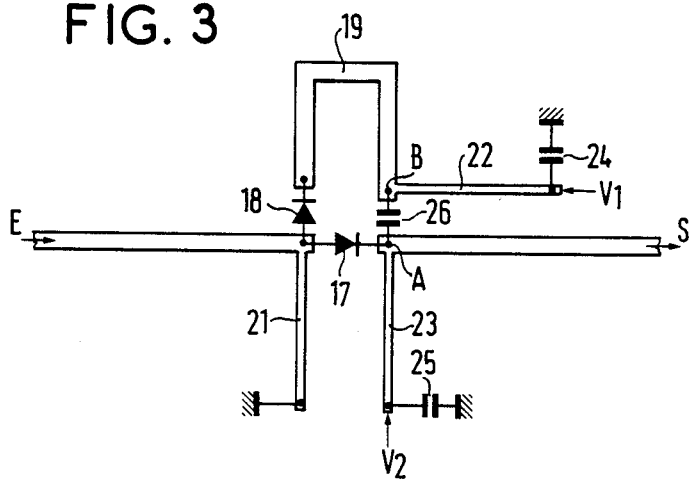

In one embodiment, as shown in FIG. 3, the two switching elements 17 and 18 are two PIN diodes.

A capacitor 26 is inserted between the point A and the end of the main line 19 which is not connected to the diode 18, with the capacitor 26 having a capacitance which makes it transparent at the microwave frequency being conveyed.

The control system 20 comprises three transmission lines 21, 23, and 22 each of length $\lambda_0/4$, and having their first ends respectively connected as follows:
for the first line 21, to the common point between the two diodes 17 and 18;
for the second line 23, to the second electrode of the first diode 17; and for the third line 22, to that end of the main line 19 which is not connected to the second diode 18.

The second end of the first line 21 is connected to ground, while the second ends of the other two lines 22 and 23 which receive respective switching signals V1 and V2 are connected to ground via respective capacitors 24 and 25.

These various quarter-wavelength lines appear to have infinite impedance as seen from the main circuit and therefore they do not disturb the signal it conveys. Thus, the control voltages V2 and V1 appear directly at points A and B, respectively.

These two signals V1 and V2 are in phase opposition, thereby causing one of the diodes 17 and 18 to conduct while preventing the other one of them from conducting. These signals vary between $+V$ and $-V$ where V is a voltage greater than the amplitude of the microwave signal conveyed, thereby enabling either diode to be rendered non-conductive.

The conducting direction of the two diodes 17 and 18 could be reversed for signals V1 and V2 of opposite polarity.

The present invention has naturally merely been described and shown by way of preferred example and its component parts could be replaced by equivalent parts without thereby going beyond the scope of the invention.

I claim:

1. A very low loss microwave modulator having two phase states: 0, $\pi$; the modulator comprising:

an input which receives a pure carrier at a frequency $f_0$;

an output which delivers a carrier modulated with two phase states;

a first switching element;

in parallel with said first switching element, a second switching element connected in series with a main transmission line; and a control system for causing a selected one of the first and second switching elements to be conductive and for causing the other one to be non-conductive;

wherein said main transmission line is of length $L=\lambda_0/2$ where $\lambda_0$ is the wavelength corresponding to the frequency $f_0$, and wherein said control circuit comprises three transmission lines of length $\lambda_0/4$ having their first ends respectively connected as follows:

the first line to the point common to the two switching elements;

the second line to the second terminal of the first switching element; and the third line to that end of the main line which is not connected to the second switching element;

the first line having its second end connected to ground, and the other two lines having their second ends connected to receive respective control signals and connected to ground via respective capacitors; and a capacitor being inserted between the main line and the second terminal of the first switching element.

2. A modulator according to claim 1, wherein the switching elements are PIN diodes.

* * * * *